United States Patent
Poustie et al.

(10) Patent No.: US 8,326,154 B2
(45) Date of Patent: Dec. 4, 2012

(54) MULTIWAVELENGTH TRANSMITTER

(75) Inventors: Alistair J. Poustie, Ipswich (GB); Graeme D. Maxwell, Ipswich (GB); Richard Wyatt, Ipswich (GB); David W. Smith, Woodbridge (GB); David G. Moodie, Suffolk (GB); Ian F. Lealman, Ipswich (GB)

(73) Assignee: Huawei Technologies Co., Ltd., Shenzhen (CN)

( * ) Notice: Subject to any disclaimer, the term of this patent is extended or adjusted under 35 U.S.C. 154(b) by 523 days.

(21) Appl. No.: 12/515,318

(22) PCT Filed: Nov. 16, 2007

(86) PCT No.: PCT/GB2007/004406
§ 371 (c)(1),
(2), (4) Date: Jan. 25, 2010

(87) PCT Pub. No.: WO2008/059281
PCT Pub. Date: May 22, 2008

(65) Prior Publication Data
US 2010/0142962 A1 Jun. 10, 2010

(30) Foreign Application Priority Data
Nov. 18, 2006 (GB) .................................. 0623075.9

(51) Int. Cl.
*H04J 14/02* (2006.01)
(52) U.S. Cl. .............................. 398/82; 398/92; 398/201
(58) Field of Classification Search ...................... 398/91, 398/201, 82, 92
See application file for complete search history.

(56) References Cited

U.S. PATENT DOCUMENTS

| 5,773,345 | A | 6/1998 | Ota |
| 6,275,317 | B1 | 8/2001 | Doerr et al. |
| 2002/0191904 | A1* | 12/2002 | Kani et al. ...................... 385/24 |

FOREIGN PATENT DOCUMENTS

| EP | 1267510 | 12/2002 |
| GB | 2202404 | 9/1988 |

OTHER PUBLICATIONS

International Search Report for corresponding application No. PCT/GB2007/04406 completed Feb. 22, 2008.

* cited by examiner

*Primary Examiner* — Leslie Pascal
(74) *Attorney, Agent, or Firm* — Slater & Matsil, LLP

(57) ABSTRACT

A multiwavelength transmitter comprises several laser sources (1) each configured to generate light of a different wavelength and a first array waveguide grating (2) arranged to direct light from each of the laser sources (1) into a first waveguide. The transmitter further comprises several electro-absorption modulators (7) each arranged to modulate light at one of the wavelengths with a respective data signal and a second array waveguide grating (6) arranged to direct each of said different wavelengths of light from the first waveguide to a respective one of the modulators (7). The optical modulators (7) are reflective optical modulators and the second array waveguide grating (6) is arranged to direct the modulated light reflected from each of the optical modulators (7) back into the first waveguide. An optical circulator (5) is provided in the first waveguide to couple modulated light from the second array waveguide grating (6) into an output waveguide. The laser sources each comprise a respective reflective semiconductor optical amplifier (1) and share a common cavity reflector (3). The first array waveguide grating (2) is located in the optical path between the semiconductor optical amplifiers (1) and the common cavity reflector (3). The transmitter has the advantage that it can be manufactured by hybrid integration of a monolithic wavelength generation sub-module and a monolithic data modulation sub-module.

8 Claims, 1 Drawing Sheet

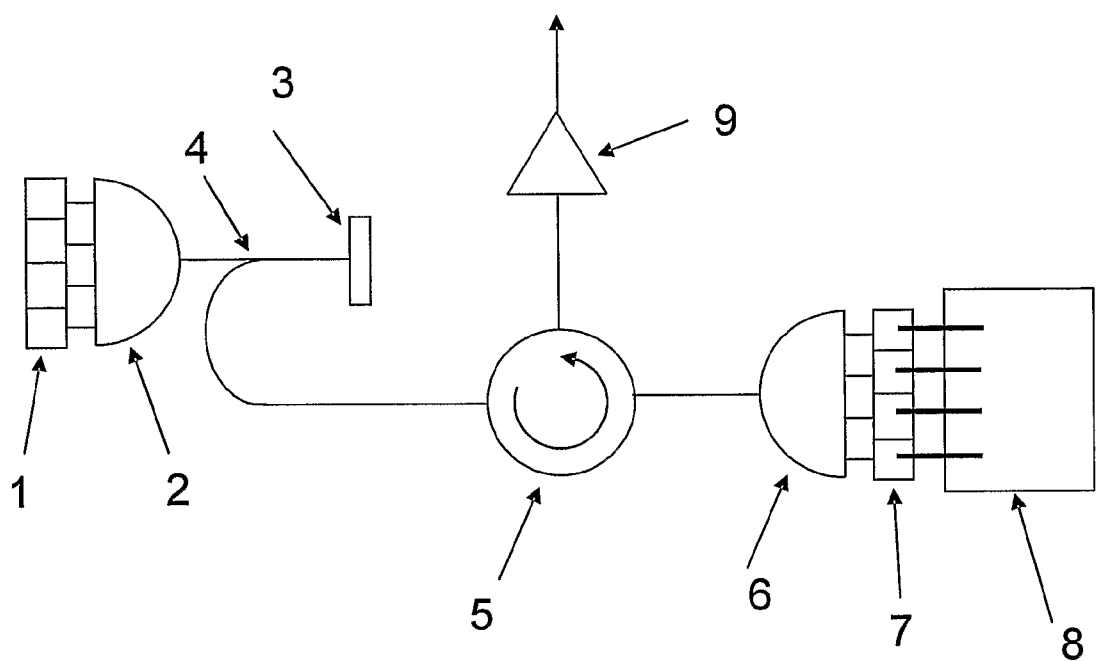

MULTIWAVELENGTH TRANSMITTER

This application is a national phase of International Application No. PCT/GB2007/004406 filed Nov. 16, 2007 and published in the English language.

FIELD OF THE INVENTION

This invention relates to a multiwavelength transmitter capable of transmitting data on multiple wavelength channels.

BACKGROUND TO THE INVENTION

Multiwavelength transmitters have been demonstrated where full monolithic integration of the indium phosphide (InP) optical elements onto a single chip is achieved. For example, a fully monolithically integrated multiwavelength transmitter has been reported by Infinera Corporation of Sunnyvale Calif., USA ("Large-Scale Photonic Integrated Circuits", Nagarajan et al, IEEE Journal of Selected Topics in Quantum Electronics, Vol 11, 1, pp 50-62, January 2005) where several wavelength source lasers and individual wavelength channel data modulators are combined with an InP arrayed waveguide grating (AWG) on a single chip. A monolithically integrated multiwavelength laser source has also been reported (IEEE Photonics Technology Letters Vol. 6 (9) p. 1082 (1994)) where individual optical gain elements are used for each wavelength channel and the different wavelength outputs are combined with an AWG.

In order to be cost effective, these devices require extremely high production yields of the optical elements in order that all the elements (and the module) function within specification.

This invention, at least in its preferred embodiments, seeks to provide a multiwavelength transmitter which does not require such high production yields.

SUMMARY OF THE INVENTION

Accordingly, this invention provides a multiwavelength transmitter comprising:
  a plurality of laser sources each configured to generate light of a different wavelength;
  a first wavelength selective filter arranged to direct light from each of the laser sources into a first waveguide;
  a plurality of optical modulators each arranged to modulate light at one of the said wavelengths with a respective data signal;
  a second wavelength selective filter arranged to direct each of said different wavelengths of light from the first waveguide to a respective one of the optical modulators; and
  an output waveguide arranged to receive the modulated light from each of the optical modulators.

The configuration of the multiwavelength transmitter into a wavelength generating section comprising the laser sources and the first wavelength selective filter and a data modulation section comprising the second wavelength selective filter and the optical modulators with the two sections connected by the first waveguide allows each section to be manufactured separately and subsequently aligned to form the transmitter. Embodiments of the invention provide a hybrid integrated multiwavelength transmitter that achieves a similar overall optical function to prior monolithic devices but allows the yield of the piece parts to be relaxed, making the transmitter higher performance and lower cost at lower optical piecepart manufacturing yields. The transmitter can comprise a combination of monolithically and hybridly integrated photonic pieceparts. Separating the functionality of the pieceparts offers technical advantages in being able to separately optimise each piecepart and allow future performance upgrading by only replacing specific parts of the module. Thermal performance and crosstalk may also be improved by allowing physical separation of the heat-generating photonic elements from other parts of the module.

The laser sources may be wavelength specific or tuneable lasers coupled to the first wavelength selective filter. However, in the presently preferred embodiment, the laser sources each comprise a respective optical gain block and the laser sources share a common cavity reflector. The first wavelength selective filter may be located in the optical path between the optical gain blocks and the common cavity reflector.

This in itself is believed to be novel and thus viewed from a further aspect the invention provides a multiwavelength transmitter comprising:
  a plurality of laser sources each configured to generate light of a different wavelength; and
  a first wavelength selective filter arranged to direct light from each of the laser sources into a first waveguide,
  wherein the laser sources each comprise a respective optical gain block and the laser sources share a common cavity reflector, and the first wavelength selective filter is located in the optical path between the optical gain blocks and the common cavity reflector.

This aspect of the invention has the technical advantage that the wavelength of the channels is determined by the passive wavelength selective element, which has a much lower temperature dependent wavelength shift than active elements (such as DFB lasers), and can by the use of several techniques be made temperature insensitive.

The wavelength selective element can be implemented by a number of different methods. This wavelength determining architecture may also remove the requirement for accurate wavelength locking of the individual lasers to a standard wavelength grid specification. The reflective gain block elements can also be operated uncooled if sufficient optical gain is still available for the laser cavity at elevated gain block temperatures. For temperature insensitive filter elements it may be possible to completely remove the need for separate wavelength locking elements, the function being performed directly by the passive wavelength selective filter used. Individual channel powers can be controlled either at the laser source or at the modulator section.

The optical modulators may be transmissive and a signal combination arrangement may be provided, such as a further wavelength selective filter, to combine the outputs of the optical modulators for coupling into the output waveguide. However, in the presently preferred arrangement, the optical modulators are reflective optical modulators. The second wavelength selective filter may be arranged to combine the modulated light reflected from each of the optical modulators for coupling into the output waveguide. This provides a particularly simple arrangement.

This in itself is believed to be novel and thus from a further aspect, the invention provides a multiwavelength transmitter comprising:
  a plurality of optical modulators each arranged to modulate light at a different wavelength with a respective data signal;
  a wavelength selective filter arranged to direct each of said different wavelengths of light from a waveguide to a respective one of the optical modulators; and an output waveguide arranged to receive the modulated light from each of the optical modulators, wherein the optical modulators are reflective optical modulators and the wavelength selective filter is arranged to combine the modulated light reflected from each of the optical modulators for coupling into the output waveguide.

The second wavelength selective filter may be arranged to direct the modulated light reflected from each of the optical modulators directly into the output waveguide. However, in the presently preferred embodiment, the second wavelength selective filter is arranged to direct the modulated light reflected from each of the optical modulators back into the first waveguide. In this arrangement, an optical circulator is provided in the first waveguide to couple modulated light from the second wavelength selective filter into the output waveguide.

The reflective modulator architecture has the advantage that the modulator elements can be physically smaller, which allows high-speed operation and increases the yield of the devices. Having close, linear access to arrays of the modulators is also advantageous for high-speed RF driving of the devices. The reflective modulator elements can also have optical gain integrated, so that each wavelength channel is amplified and modulated.

Viewed from a broad aspect the invention provides a multiwavelength transmitter in which the functions of wavelength generation and modulation are performed by hybrid integrated sub-modules. The hybrid integrated sub-modules may contain monolithically integrated arrays of active optoelectronic devices. Thermal dissipation and crosstalk may be controlled by physically separating the active elements onto separate chips.

The laser sources may form a first semiconductor device and the optical modulators may form a second semiconductor device. The first and second semiconductor devices may be hybrid integrated to form the transmitter. The first and/or the second semiconductor device may be a monolithic semiconductor device.

The multiple wavelengths may be generated from a shared wavelength selective element coupled to separate optical gain blocks for each wavelength and a shared cavity reflector. The shared cavity reflector may have a wavelength dependent response for control of the emission wavelengths.

The optical gain block may be a semiconductor optical amplifier. The optical power of each channel may be controlled by adjusting the bias of the separate optical gain blocks.

The multiple wavelengths may be separately modulated using reflective modulator elements. The multiple wavelengths may be separately modulated and amplified using reflective amplifying modulator elements. The reflective modulator elements may be electroabsorption modulators or gain switched semiconductor optical amplifiers. The reflective modulator elements may contain a mechanism for adjusting the individual channel optical powers. Modulation and amplification may be performed in a monolithically integrated electroabsorption modulator and semiconductor optical amplifier. In this implementation it is also possible to control the level of individual channels by controlling the individual bias currents to the optical amplifier section of the monolithically integrated modulator-amplifier combination.

The first wavelength selective filter and/or the second wavelength selective filter may be an array waveguide grating.

The multiwavelength transmitter may include a first array waveguide grating device used to provide wavelength selective feedback to a plurality of transmitters and a second array waveguide grating device to distribute and combine signals to and from an array of reflective modulators. The first array waveguide grating may be arranged to have a 3 dB passband for any individual channel significantly less than the spacing between channels. The second array waveguide grating may have a 3 dB passband with a flat top or near flat top passband for any individual channel.

Thus, the first wavelength selective filter may have a respective passband for each of the different wavelengths. The bandwidth of each passband may be substantially smaller than the difference in wavelength between adjacent passbands.

The second wavelength selective filter may have a respective passband for each of the different wavelengths. The response of the filter may remain substantially constant with increasing wavelength within each passband.

A single optical circulator may be used to direct signals from the multiwavelength laser array to a reflective modulator array and return signals from the reflective modulator array to an output port.

BRIEF DESCRIPTION OF THE DRAWINGS

An embodiment of the invention will now be described by way of example only and with reference to the accompanying drawings, in which:

FIG. 1 is a schematic view of a multiwavelength transmitter architecture according to an embodiment of the invention.

DETAILED DESCRIPTION OF AN EMBODIMENT

FIG. 1 shows a schematic diagram of a multiwavelength transmitter architecture according to an embodiment of the invention. The transmitter architecture comprises a monolithic array of reflective optical gain blocks 1 connected via a wavelength selective filter 2 to a common laser cavity reflector 3. The multiwavelength light is output via a cavity coupler 4 and passed via an optical circulator 5 to a second wavelength selective filter 6. The optical outputs of the filter 6 are connected to a monolithic array of reflective modulators 7, which are electrically driven via radio frequency (RF) lines 8. The modulated multiwavelength output data is directed by the circulator 5 to the output. An optional multiwavelength optical amplifier 9 can be used to increase the output power of the data channels.

In the embodiment of FIG. 1, the multiple wavelength continuous wave (cw) channels are generated from a laser structure containing broadband reflective gain blocks 1, a wavelength selective filter 2 and a common cavity mirror 3. The wavelength selective combiner 2 may take different forms, such as an arrayed waveguide grating (AWG) or an Echelle grating.

The broadband gain blocks 1 may be reflective semiconductor optical amplifiers (RSOAs) with a rear reflective facet coating. The front facet of the RSOA 1 may have optical mode size adaptation for optimising the optical coupling to the wavelength combining element 2 (e.g. AWG) and for minimising the facet reflection in the device. The use of large optical mode sizes (similar to standard optical fibre) also allows passive alignment of the RSOA array 1 to the AWG 2 due to the relaxed alignment tolerances. The bias current of the RSOA 1 can be used to adjust the output power of each individual wavelength channel. The RSOA 1 can also be operated uncooled where the device is selected to retain sufficient gain to overcome the individual channel cavity loss at elevated operating temperatures. The RSOA 1 can also be designed for single polarisation operation since it forms part of the laser cavity.

The AWG 2 is a planar silica device with a highly selective wavelength channel response (e.g. Gaussian) so that the laser wavelength is well defined. The AWG 2 can also be polarisation sensitive with the optimised polarisation performance aligned to the RSOA 1 polarisation axis. In this laser structure, the wavelength of the lasing channels is mainly determined by the AWG 2 wavelength response. The AWG 2 can also be made athermal, either by overlaying the silica with a polymer cladding or by physically separating the multiwavelength output waveguide and using a thermo-mechanical compensation.

The common cavity mirror 3 may incorporate a wavelength selective coating (e.g. broad bandpass reflector) to ensure that the lasers emit in a specific wavelength band. Other optional optical components (such as a shared wavelength locker or an additional frequency selective element such as an etalon) can be incorporated with the common cavity mirror 3 if desired. The multiple lasing wavelengths are coupled out of the laser cavity with a coupler 4 and fed via an optical circulator 5 to the data modulation section. The coupler ratio is optimised for high laser output power (typically ~3 dB coupling). In an alternative arrangement, the multiple lasing wavelengths may exit the laser cavity directly through the common cavity mirror 3.

In a further variant, the laser source may employ a monolithic array of wavelength specific (or tuneable) lasers coupled to the wavelength selective filter 2 in place of the optical gain blocks 1 shown in FIG. 1. In this case, the common laser mirror 3 and coupler 4 are not required.

Data modulation is imposed on each wavelength channel separately by splitting the wavelengths with a second AWG 6 and using a reflective electroabsorption modulator (EAM) array 7. This second AWG 6 may have a flat top response so that the wavelength transmission characteristics are relatively insensitive to input wavelength variation. The AWG 6 is also designed to be polarisation insensitive, so that the wavelength response variation with respect to input polarisation state is minimised. The EAMs 7 are based on indium phosphide (InP) devices with a rear facet reflective coating. These devices can also have optical spot size adaptation on the front facet to maximise coupling efficiency and allow passive alignment of the array. The EAMs 7 are designed to have sufficient electrical bandwidth for the data rate and are driven by RF signals 8 coupled to the edge of the EAM array 7. The electrical connections to the EAM 7 can also be split so that there is a separate DC section to act as a variable attenuator to adjust individual channel output powers. The reflective EAM 7 can also be a monolithic semiconductor optical amplifier/electroabsorption modulator (SOA/EAM) device where the SOA provides individual optical channel gain and can also perform channel power control if required.

The modulated and reflected wavelength channels are then recombined by the second AWG 6 and directed out of the transmitter via the optical circulator 5. An optional multiwavelength optical amplifier 9 can be used here to amplify the output channels of the transmitter. Optional multiwavelength optical amplifiers can also be placed at other parts of the transmitter circuit (e.g. after the laser and before the circulator) to amplify the power levels if required.

The wavelength generation section 1, 2, 3, 4 and the data modulation section 6, 7, 8 may be formed as separate monolithic devices and combined through hybrid integration. Hybrid integration of active optical devices and passive optical devices has been reported by NEC Corporation of Tokyo, Japan, The Centre for Integrated Photonics Limited, of Martlesham Heath, United Kingdom, Xponent Photonics, Inc. of Monrovia Calif., USA and Nippon Telegraph and Telephone Corporation of Tokyo, Japan, where optical devices from different material systems are aligned to form optical sub-systems.

This embodiment of the invention uses a multiwavelength laser source combined with an array of optical modulators to achieve a low form factor. The integration of these pieceparts is designed so that they can be passively aligned to maintain high optical coupling efficiency, but with greatly reduced assembly costs.

In summary, a multiwavelength transmitter comprises several laser sources 1 each configured to generate light of a different wavelength and a first array waveguide grating 2 arranged to direct light from each of the laser sources 1 into a first waveguide. The transmitter further comprises several electroabsorption modulators 7 each arranged to modulate light at one of the wavelengths with a respective data signal and a second array waveguide grating 6 arranged to direct each of said different wavelengths of light from the first waveguide to a respective one of the modulators 7. The optical modulators 7 are reflective optical modulators and the second array waveguide grating 6 is arranged to direct the modulated light reflected from each of the optical modulators 7 back into the first waveguide. An optical circulator 5 is provided in the first waveguide to couple modulated light from the second array waveguide grating 6 into an output waveguide. The laser sources each comprise a respective reflective semiconductor optical amplifier 1 and share a common cavity reflector 3. The first array waveguide grating 2 is located in the optical path between the semiconductor optical amplifiers 1 and the common cavity reflector 3. The transmitter has the advantage that it can be manufactured by hybrid integration of a monolithic wavelength generation sub-module and a monolithic data modulation sub-module.

The invention claimed is:

1. A multiwavelength transmitter comprising:
    a plurality of laser sources each configured to generate light of a different wavelength;
    a first wavelength selective filter arranged to direct light from each of the laser sources into a first waveguide;
    a plurality of optical modulators each arranged to modulate light at one of the said wavelengths with a respective data signal;
    a second wavelength selective filter arranged to direct each of said different wavelengths of light from the first waveguide to a respective one of the optical modulators; and
    an output waveguide arranged to receive the modulated light from each of the optical modulators, and
    wherein the laser sources each comprise a respective optical gain block and the laser sources share a common cavity reflector, and the first wavelength selective filter is located in the optical path between the optical gain blocks and the common cavity reflector, and
    wherein the common cavity reflector is configured to direct wavelengths either directly out of the laser cavity or out of the laser cavity via a coupler.

2. A multiwavelength transmitter as claimed in claim 1, wherein the optical modulators are reflective optical modulators and the second wavelength selective filter is arranged to combine the modulated light reflected from each of the optical modulators for coupling into the output waveguide.

3. A multiwavelength transmitter as claimed in claim 2, wherein the second wavelength selective filter is arranged to direct the modulated light reflected from each of the optical modulators back into the first waveguide, and an optical circulator is provided in the first waveguide to couple modulated light from the second wavelength selective filter into the output waveguide.

4. A multiwavelength transmitter as claimed in claim 1, wherein the second wavelength selective filter has a respective passband for each of the different wavelengths and the response of the filter remains substantially constant with increasing wavelength within each passband.

5. A multiwavelength transmitter as claimed in claim 1, wherein the laser sources form a first semiconductor device and the optical modulators form a second semiconductor device and the first and second semiconductor devices are hybrid integrated to form the transmitter.

6. A multiwavelength transmitter as claimed in claim 5, wherein the first and/or the second semiconductor device is a monolithic semiconductor device.

7. A multiwavelength transmitter as claimed in claim 1, wherein the first wavelength selective filter and/or the second wavelength selective filter is an array waveguide grating.

8. A multiwavelength transmitter as claimed in claim 1, wherein the first wavelength selective filter has a respective passband for each of the different wavelengths and the bandwidth of each passband is substantially smaller than the difference in wavelength between adjacent passbands.

* * * * *